United States Patent
Shen

(10) Patent No.: US 8,058,109 B2
(45) Date of Patent: Nov. 15, 2011

(54) METHOD FOR MANUFACTURING A SEMICONDUCTOR STRUCTURE

(75) Inventor: Geng-Shin Shen, Hsinchu (TW)

(73) Assignee: Chipmos Technologies Inc. (TW)

( * ) Notice: Subject to any disclaimer, the term of this patent is extended or adjusted under 35 U.S.C. 154(b) by 0 days.

(21) Appl. No.: 12/899,530

(22) Filed: Oct. 6, 2010

(65) Prior Publication Data
US 2011/0207262 A1 Aug. 25, 2011

(30) Foreign Application Priority Data
Feb. 22, 2010 (TW) ................................ 99104975 A

(51) Int. Cl.
*H01L 21/00* (2006.01)
(52) U.S. Cl. . 438/127; 438/112; 257/787; 257/E23.126; 257/E33.059
(58) Field of Classification Search ................... 438/112, 438/126
See application file for complete search history.

(56) References Cited

U.S. PATENT DOCUMENTS

| 6,774,026 B1* | 8/2004 | Wang et al. ................... 438/612 |
| 2003/0151140 A1* | 8/2003 | Nishiyama et al. ............ 257/737 |
| 2009/0260229 A1* | 10/2009 | Motomura et al. ............. 29/840 |

* cited by examiner

*Primary Examiner* — Ha Tran T Nguyen
*Assistant Examiner* — Shaka Scarlett
(74) *Attorney, Agent, or Firm* — Cantor Colburn LLP

(57) ABSTRACT

The present invention provides a method for manufacturing a semiconductor structure, —including—the following steps of: forming a substrate having a package array; forming a thermosetting non-conductive layer covering the substrate; partially solidifying the thermosetting non-conductive layer to form a semi-solid non-conductive layer; connecting chips to the package array on the substrate; pressing and heating the chips and the substrate so that the semi-solid non-conductive layer adheres with the chips and the substrate; pre-heating an encapsulant preformed on a metal layer; covering the chips on the substrate with the encapsulant; and solidifying the encapsulant to completely cover the chips on the substrate. The present invention can reduce use of gold to lower the manufacturing cost and can also improve the heat conduction efficiency of the semiconductor structure to enhance operational stability of the chips.

12 Claims, 9 Drawing Sheets

METHOD FOR MANUFACTURING A SEMICONDUCTOR STRUCTURE

This application claims priority to Taiwan Patent Application No. 099104975 filed on Feb. 22, 2010.

CROSS-REFERENCES TO RELATED APPLICATIONS

Not applicable.

BACKGROUND OF THE INVENTION

1. Field of the Invention

The present invention relates to a method for manufacturing a semiconductor structure, and more particularly, to a method for manufacturing a semiconductor package structure.

2. Descriptions of the Related Art

Semiconductor packaging processes have been widely used to electrically connect a semiconductor chip to an external component and also to protect the semiconductor chip from damages caused by external conditions. However, packaging materials and the packaging processes used are not only associated with the manufacturing cost, but also have an influence on operational performance of the packaged chip. For this reason, the packaging structure and materials thereof selected for use become very important.

Conventionally, a chip is electrically connected and bonded to a substrate, with bumps of the chip being electrically connected to contact pads of the substrate respectively. As gold features good electrical conductivity, conventional bumps are typically made of gold as a primary material. Furthermore, in the conventional processes, the chip must be encapsulated with a resin after the chip is disposed on the substrate.

Unfortunately, because gold is very expensive and the process of encapsulating each chip with a resin respectively is much complex, the manufacturing cost of the packaging structure is increased. Moreover, the resin, which is not a kind of good thermally conductive medium, has a negative effect on heat dissipation efficiency of the semiconductor chip in future operations, which will further affect operational stability of the semiconductor chip. In view of this, it is highly desirable in the art to provide a solution that can lower the manufacturing cost of a packaging structure and, meanwhile, improve heat conduction efficiency of a chip in operation.

SUMMARY OF THE INVENTION

The primary objective of the present invention is to provide a method for manufacturing a semiconductor structure, which reduces use of gold by replacing the gold bumps with composite bumps. Thereby, the manufacturing cost is lowered.

Another objective of the present invention is to provide a method for manufacturing a semiconductor structure, which forms a metal layer on an encapsulant for packaging the semiconductor structure. Thereby, the heat conduction efficiency of the semiconductor structure in future operations is improved.

To accomplish the aforesaid objectives, the method for manufacturing a semiconductor structure of the present invention comprises the following steps of: (a) forming a package array on a substrate, wherein the package array has a plurality of contact pads and a protection layer, and the plurality of the contact pads are exposed to the outer side of the protection layer; (b) forming a thermosetting non-conductive layer covering the substrate; (c) partially solidifying the thermosetting non-conductive layer to form a semi-solid non-conductive layer; (d) connecting chips to the package array on the substrate, wherein each of the chips has an active surface, a plurality of chip pads and a plurality of composite bumps, the chip pads are formed on the active surface, and the composite bumps are formed on the chip pads so that the composite bumps electrically connect to each of the contact pads; (e) pressing and heating the chips and the substrate so that the semi-solid non-conductive layer adheres with the chips and the substrate; (f) pre-heating an encapsulant preformed on a metal layer; (g) covering the chips of the package array on the substrate with the encapsulant; and (h) solidifying the encapsulant to completely cover the chips on the substrate.

As compared to the prior art, the present invention provides the following benefits: the method for manufacturing a semiconductor structure of the present invention replaces the conventional bumps, which use gold as a primary material, with the composite bumps, so the cost of semiconductor packaging is lowered; furthermore, the method for manufacturing a semiconductor structure of the present invention retains the metal layer, which is originally used as a support layer of the encapsulant, in the semiconductor structure to assist in conducting heat generated in the semiconductor structure in future operations, so the heat conduction efficiency and thus the operational stability of the semiconductor structure can be improved remarkably.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
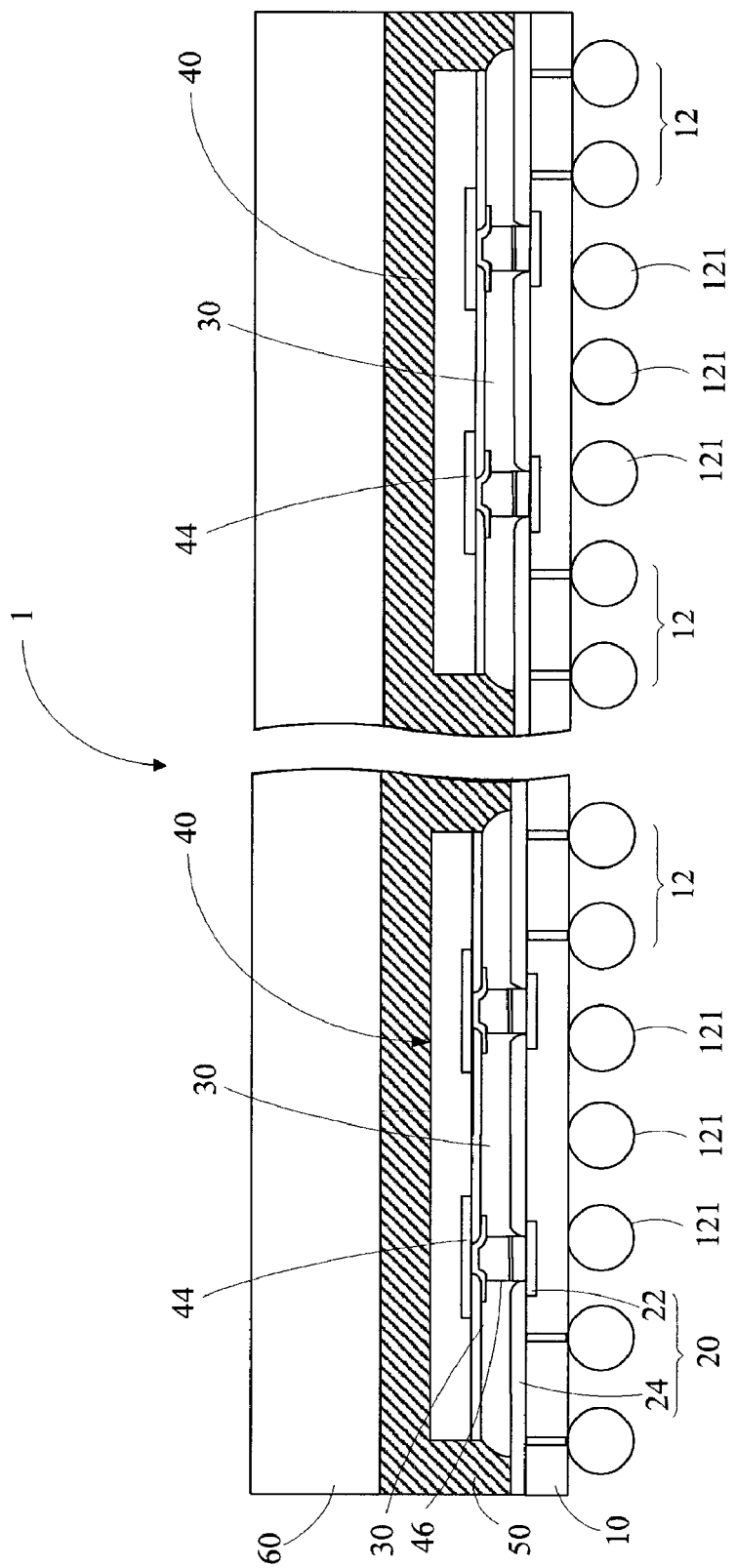
FIG. 1A is a schematic view of a semiconductor structure according to an embodiment of the present invention.
Figure 1B:
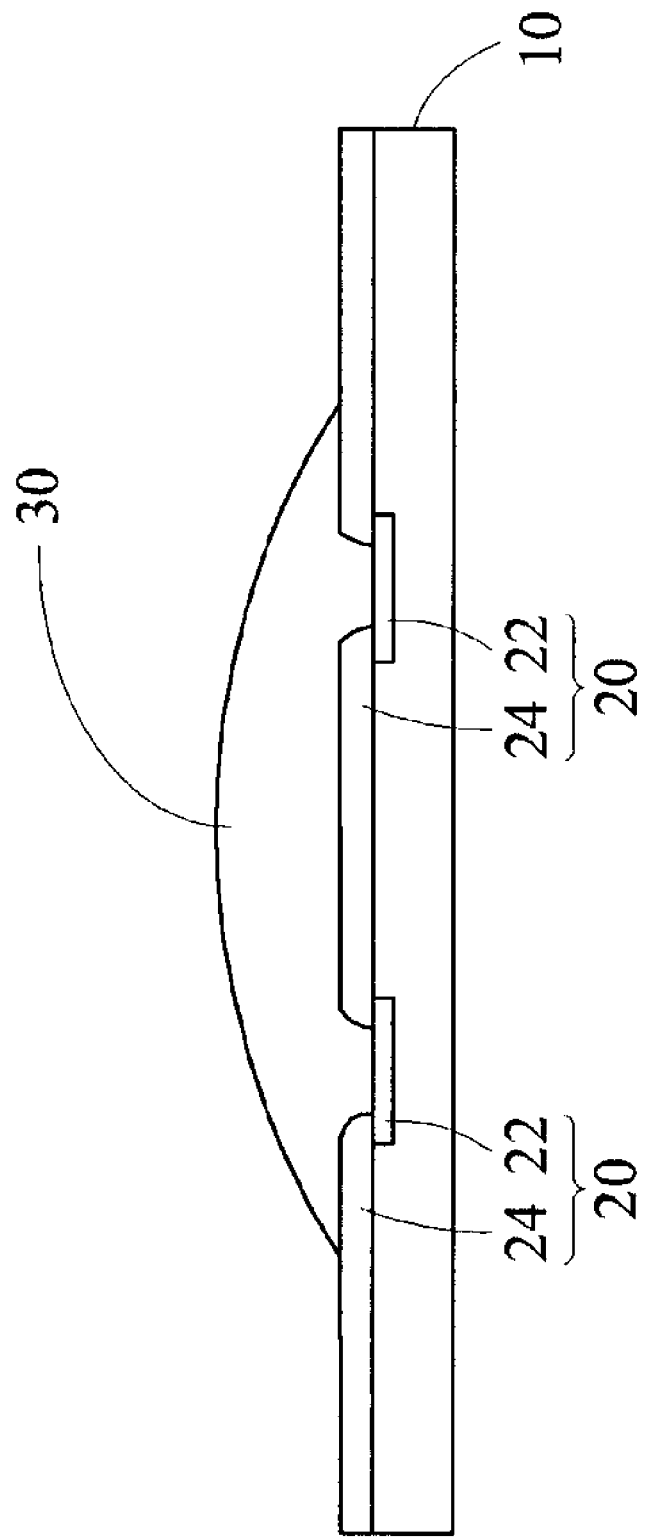
FIG. 1B is a schematic view of a substrate, a package array and a non-conductive layer of a semiconductor structure that has not been packaged according to an embodiment of the present invention.

Referring to FIG. 1A, an embodiment of a semiconductor structure 1 according to the present invention is shown therein. Specifically, the semiconductor structure 1 of this embodiment may be a flip-chip ball grid array (BGA) package structure, and may be further sliced into a plurality of integrated circuits (ICs), which will be detailed hereinafter. Referring to FIG. 1A and FIG. 1B, the semiconductor structure 1 comprises a substrate 10, a package array 20, a non-conductive layer 30, a plurality of chips 40, an encapsulant 50 and a metal layer 60. The package array 20 is formed on the substrate 10, the non-conductive layer 30 covers the substrate 10 and the package array 20, the plurality of chips 40 adheres to the package array 20 on the substrate 10 by means of the non-conductive layer 30, the encapsulant 50 covers the chips 40 on the substrate 10, and the metal layer 60 is located on the encapsulant 50 of the chips 40.

Specifically, in this embodiment of the present invention, the substrate 10 may be one of the following substrates: a bismaleimide-triazine (BT) substrate, a glass epoxy resin (FR-4, FR-5) substrate, and a polyimide (PI) substrate, although it is not limited thereto. The substrate 10 comprises a plurality of solder balls 12, which are disposed on a lower surface of the substrate 10 opposite to the chips 40 and used as terminals for transmitting signals to and from the outside in the flip-chip BGA package structure. In this embodiment, the solder balls 12 include a plurality of thermally conductive solder balls 121 to improve the heat conduction efficiency of the flip-chip BGA package structure.

Figure 1C:
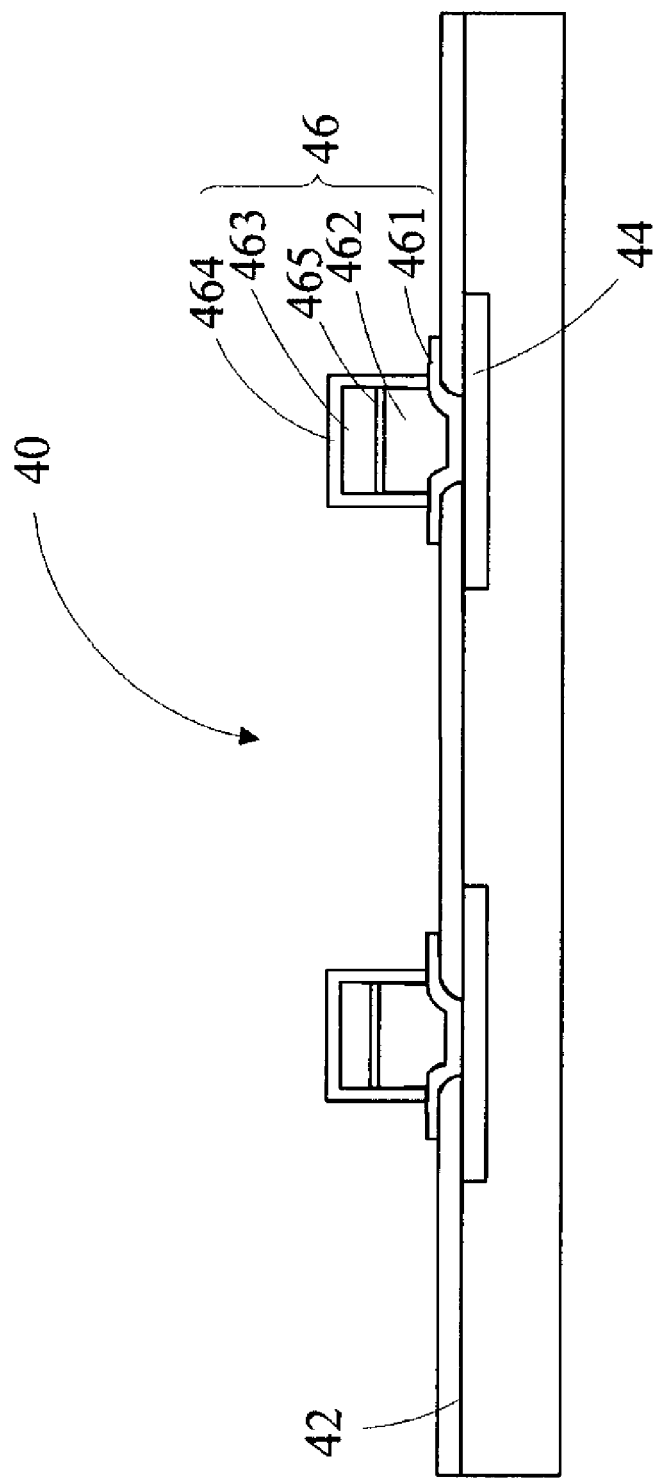
FIG. 1C is a schematic view of a chip in a semiconductor structure that has not been packaged according to an embodiment of the present invention.
Figure 1D:
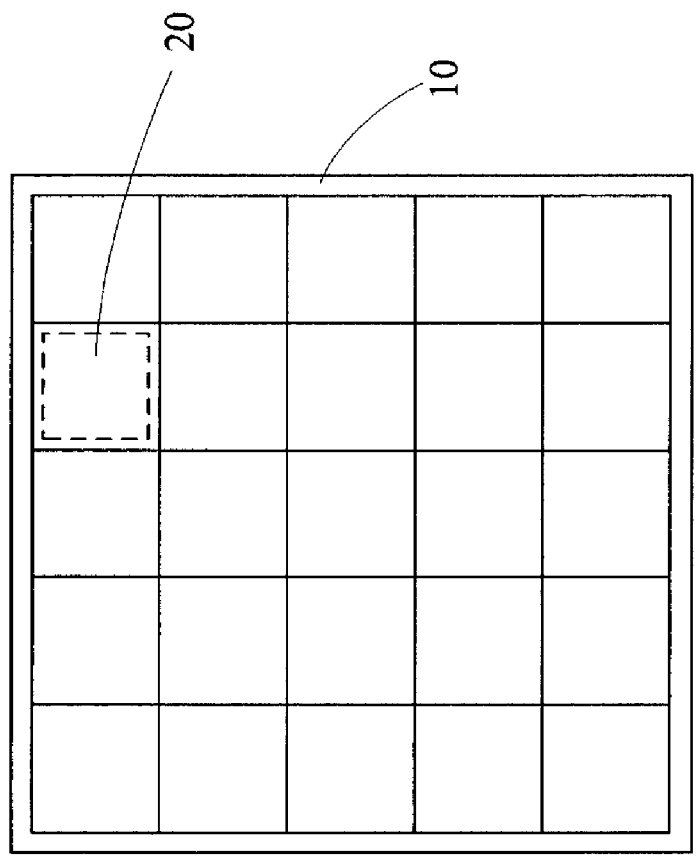
FIG. 1D is a schematic view of a package array in a semiconductor structure according to an embodiment of the present invention.

Secondly, the package array 20 on the substrate 10 is arranged in form of an array having two or more rows and two or more columns (see FIG. 1D). Each package array 20 comprises a circuit (not shown), a plurality of contact pads 22 and a protection layer 24 for protection against soldering. The contact pads 22 are exposed out of the protection layer 24 for electrical connection with the plurality of chips 40 later. Furthermore, to enhance the electrical conductivity between the contact pads 22 and the chips 40, a covering layer (not shown), which may be made of a metal material such as nickel, gold or tin, is formed on each of the contact pads 22. On the other hand, the non-conductive layer 30 covering the substrate 10 and the package array 20 is formed with a plurality of openings 32 (see FIG. 2C) to expose the contact pads 22. In this embodiment, the non-conductive layer 30 is a non-conductive film (NCF) or a paste such as a non-conductive paste (NCP), which is formed between the substrate 10 and the chip 40 and used to securely adhere with and support the flip chip 40 in a mechanical way when the chip 40 is to be flip-chip bonded to the substrate 10 later. This can prevent failure of the electrical connection between the chips 40 and the substrate 10 due to undue inclination of the chips 40 and also prevent penetration of moisture.

In this embodiment, the chips 40 may be, for example, a display drive circuit IC, an image sensor IC, a memory IC, a non-memory IC, an ultra-high frequency (UHF) or a radio frequency (RF) IC, but it is not limited thereto. Each of the chips 40 adheres to the package array 20 of the substrate 10 by means of the non-conductive layer 30. Referring to FIG. 1C together, each of the chips 40 comprises an active surface 42, a plurality of chip pads 44 and a plurality of composite bumps 46. Specifically, the chip pads 44 are formed on the active surface 42, the composite bumps 46 are formed in turn on the chip pads 44, and each of the composite bumps 46 is electrically connected to one of the contact pads 22 through a corresponding opening 32 in the non-conductive layer 30.

Referring to FIG. 1C, as shown therein, each of the composite bumps 46 of the chip 40 comprises an under bump metallization (UBM) layer 461, a first conductive layer 462 and a second conductive layer 463. The first conductive layer 462 is located on the UBM layer 461, and the second conductive layer 463 is in turn located on the first conductive layer 462. The UBM layer 461 may be made of a material selected from titanium, tungsten, copper, and alloys thereof. The first conductive layer 462 may be made of a material selected from a group consisting of copper, nickel, aluminum, zinc, and combinations thereof. The second conductive layer 463 may be made of a material selected from a group consisting of gold, copper, silver, tin, zinc, indium, and combinations thereof.

In the preferred embodiment, each of the composite bumps 46 further comprises a covering conductive layer 464 that covers the second conductive layer 463, the first conductive layer 462 and the UBM layer 461. The covering conductive layer may be made of gold, but it is not limited thereto. Additionally, each of the composite bumps 46 may further comprise a barrier layer 465 located between the first conductive layer 462 and the second conductive layer 463. The barrier layer 465 may be made of nickel, but it is not limited thereto.

It shall be noted that, the composite bumps 46 disclosed above are only provided as an example, and as may be appreciated by those of ordinary skill in the art, the composite bumps 46 may also be "composite" bump structures formed by other existing bumps in combination (for example, the composite bumps 46 are formed by two layers of stud bumps) to satisfy different demands for electrical connection between different kinds of flip chips and the substrate and to lower the manufacturing cost by reducing use of gold.

Referring back to FIG. 1A, the encapsulant 50 covering the plurality of chips 40 on the substrate 10 is a composite resin layer, a material of which may be selected from thermoplastic resins such as acrylic resins, polyimide resins or polysulfone resins, thermosetting resins such as epoxy resins, phenolic resins, tripolycyanamide resins or polyester resins, or combinations thereof. Additionally, one of the features of the present invention is that, the metal layer 60 used in the original process for supporting the encapsulant 50 is retained in the semiconductor structure 1 to assist in heat dissipation during operation of the chips 40, thereby to improve the heat conduction efficiency of the flip-chip BGA package structure. Preferably, to enable the encapsulant 50 to securely bond with the metal layer 60, the metal layer 60 is formed with a plurality of openings 601 (see FIG. 2D) so that, when the encapsulant 50 is preformed on the metal layer 60, the encapsulant 50 can be filled into the openings 601. The openings 601 may be patterned; for example, the plurality of openings 601 on the metal layer may be arranged into a mesh pattern, an annular pattern or other patterns. Additionally, to further strengthen the bonding between the metal layer 60 and the encapsulant 50, the metal layer 60 may further have a bonding surface 602. For example, the bonding surface 602 may have convex structures 603 or concave structures 604 regularly or irregularly distributed on the bonding surface 602, or have partial convex structures 603 and partial concave structures 604 regularly or irregularly distributed on the bonding surface 602 (see FIG. 2D). Through arrangement of the convex structures 603 and/or concave structures 604, a contact surface area between the metal layer 60 and the encapsulant 50 is enlarged to facilitate more secure bonding therebetween. Additionally, the partial convex structures 603 of the bonding surface 602 may further shorten the distance between the metal layer 60 and the chip 40 and may even make physical contact with an upper surface of the chip 40, thereby enhancing the heat conduction efficiency and the operational stability of the chip.

Hereinbelow, an embodiment of the method for manufacturing the semiconductor structure 1 of the present invention will be detailed with reference to the above descriptions, the attached drawings and FIG. 2A to FIG. 2D. It shall be noted that, for simplicity of the description, the method for manufacturing the semiconductor structure 1 will be described with a flip chip as a representative example in the following descriptions and the attached drawings.

Figure 2A:
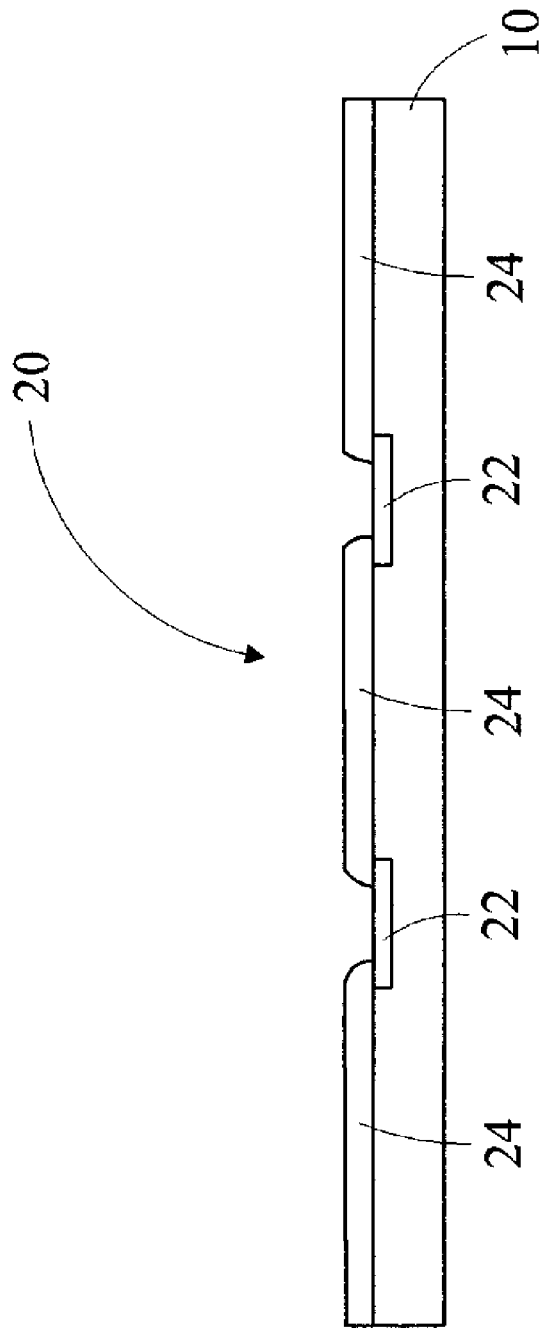
FIG. 2A to FIG. 2E are schematic views illustrating a process of manufacturing a semiconductor structure according to an embodiment of the present invention.

Referring to FIG. 2A, as shown therein, the package array 20 is formed on the substrate 10. More specifically, after a circuit and a plurality of contact pads 22 are formed successively on the substrate 10, the protection layer 24 for protection against soldering is formed. Next, the protection layer 24 is patterned to expose the contact pads 22, thus forming the package array 20 on the substrate 10. Preferably, a covering layer may be further formed on the contact pads 22, and the covering layer may be made of a metal material such as nickel, gold or tin.

Figure 2B:
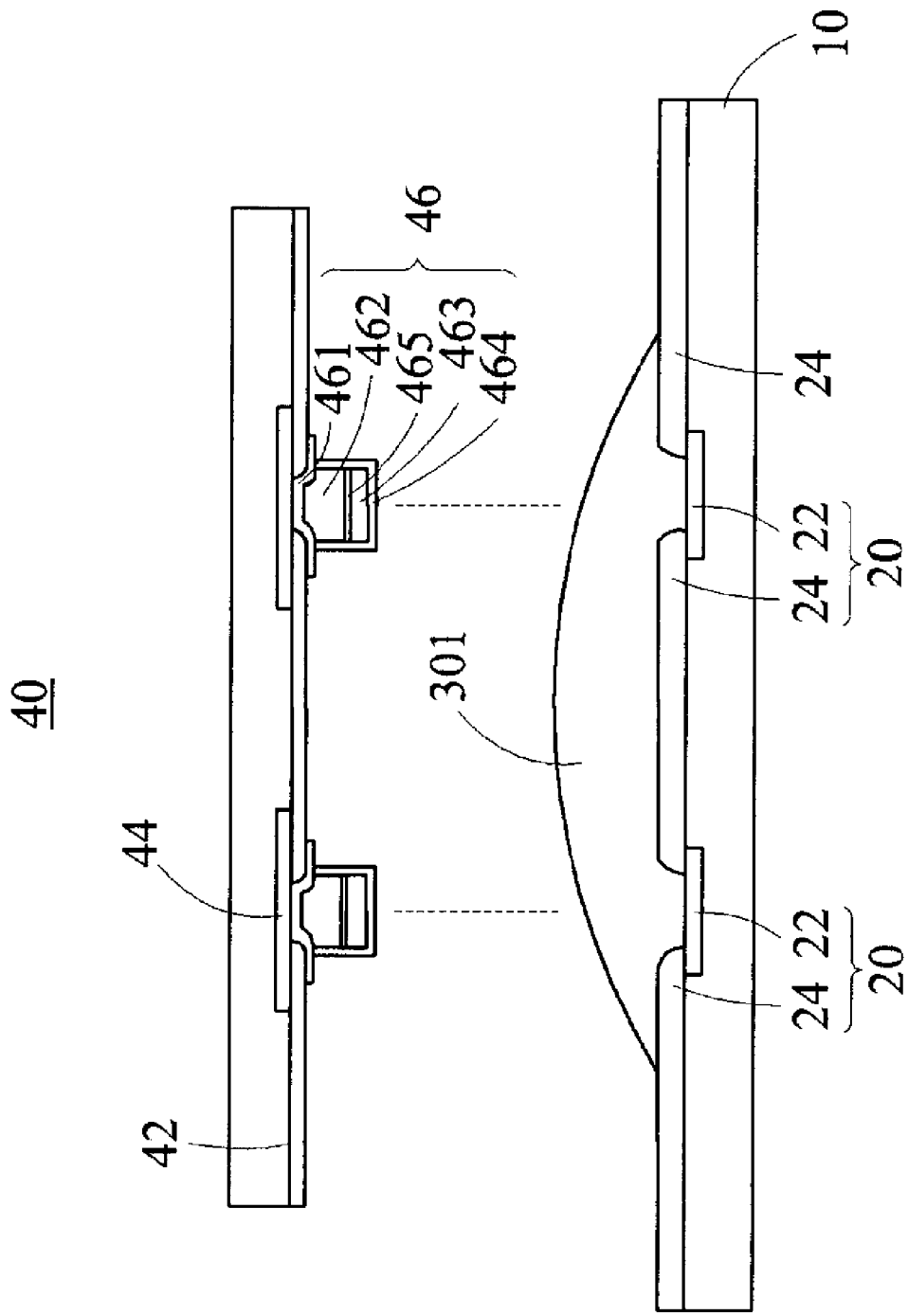

Next, referring to FIG. 2B together, as shown therein, a thermosetting non-conductive layer is applied to the substrate to flip-chip bond a chip to the substrate; for example, a non-conductive paste (NCP) 301 is formed on the substrate 10 to cover the contact pads 22 and portions of the protection layer 24. Then, the thermosetting non-conductive layer 301 is partially solidified to form a semi-solid non-conductive layer. It shall be emphasized that, the semi-solid non-conductive layer 301 is in a solid state or non-adhesive at the normal temperature to facilitate handling or stacking during the manufacturing process, which is favorable for convenience of the subsequent packaging process; furthermore, the semi-solid non-conductive layer 301 may also be used as a support during the subsequent flip-chip bonding process. Thereafter, the chip 40 is flip-chip bonded to the package array 20 of the substrate 10 in such a way that each of the composite bumps 46 on the active surface 42 of the chip 40 can be electrically connected to a corresponding contact pad 22 respectively. More specifically, ultrasonic waves may be applied to the chip 40 to have the composite bumps 46 pass through the non-conductive paste 301 to electrically connect with the contact pads 22. During the flip-chip bonding process, heating at a temperature of 40° C. to 200° is carried out to render the semi-solid non-conductive paste 301 between the chip 40 and the substrate 10 adhesive, so as to adhere the chip 40 to the substrate 10. Subsequently, the chip 40 and the substrate 10 are pressed and heated at a temperature of 100° C. to 500° to thermally cure the non-conductive paste 301 so that the chip 40 is bonded to the substrate 10 securely.

Figure 2C:
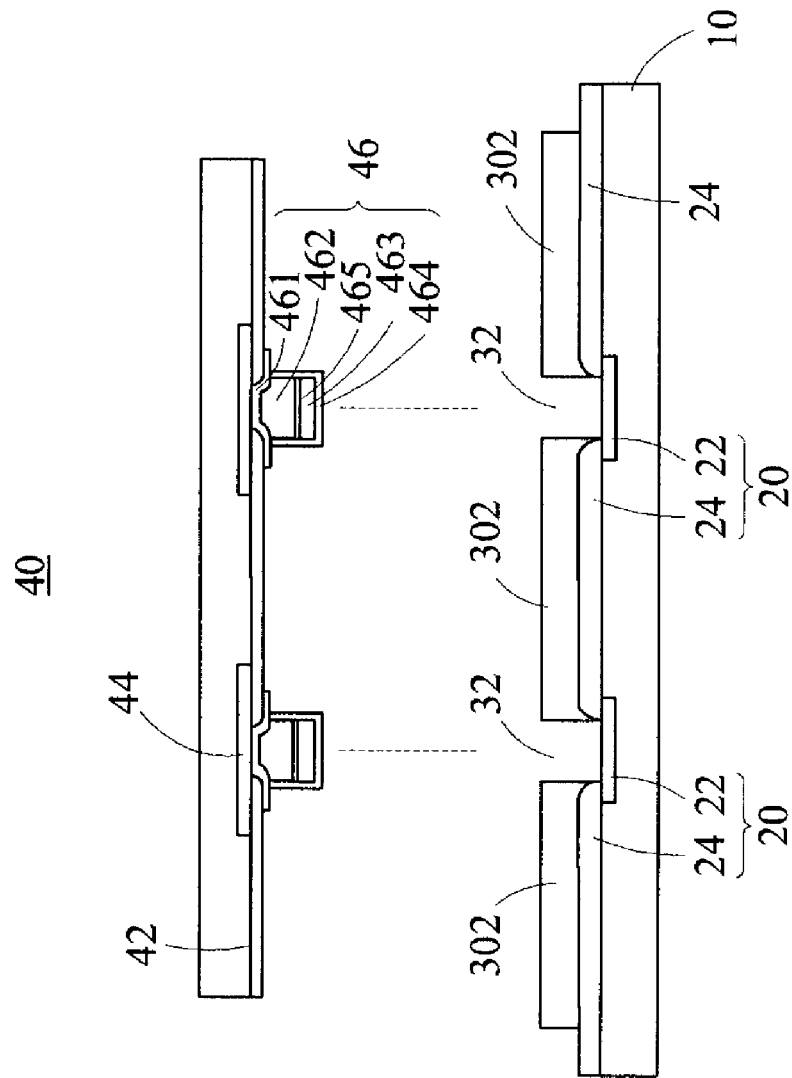

Alternatively, referring to FIG. 2C, an example in which another thermosetting non-conductive layer is applied to the substrate to flip-chip bond the chip to the substrate is shown therein. For example, a non-conductive film (NCF) 302 is formed on the substrate 10 to cover the contact pads 22 and portions of the protection layer 24. Particularly, the non-conductive film 302 may be patterned in advance to form a plurality of openings 32 and then printed or pasted to the substrate 10. Thus, when the non-conductive film 302 is formed on the substrate 10, the contact pads 22 on the substrate 10 will be exposed simultaneously. Then, through ultra-violet (UV) irradiation or through heating at a temperature of 40° C. to 200°, the non-conductive film 302 is partially solidified to form a semi-solid non-conductive layer 302. Like what described above, the semi-solid non-conductive film 302 is also in a solid state or non-adhesive at the normal temperature, so it is convenient for handling or stacking on each other during the subsequent processes and may also be used as a support during the subsequent flip-chip bonding process. The subsequent process of flip-chip bonding the chip 40 to the package array 20 of the substrate 10 is just the same as that described in the aforesaid example, so reference may be made to the above descriptions and this will not be further described herein.

Further, it shall be noted that, for the chip 40 shown in FIG. 2B and FIG. 2C, the step of forming the composite bumps on the chip 40 comprises: forming a UBM layer 461 on each of the chip pads 44; then, forming a first conductive layer 462 on each of the UBM layers 461; and finally, forming a second conductive layer 463 on each of the first conductive layers 462. For conductive materials of which the UBM layer 461, the first conductive layer 462 and the second conductive layer 463 are made, reference may be made to the above descriptions. Furthermore, preferably, the step of forming the first conductive layer 461 may comprise forming a barrier layer 465 of nickel between the first conductive layer 462 and the second conductive layer 463. Subsequent to formation of the second conductive layer 463, a covering conductive layer 464 may be formed of gold to cover the second conductive layer 463, the first conductive layer 462 and the UBM layer 461. As will be appreciated by those of ordinary skill in the art upon reviewing the above descriptions, other existing processes for composite bumps may also be applied in the present invention, and this will not be further described herein.

Figure 2D:
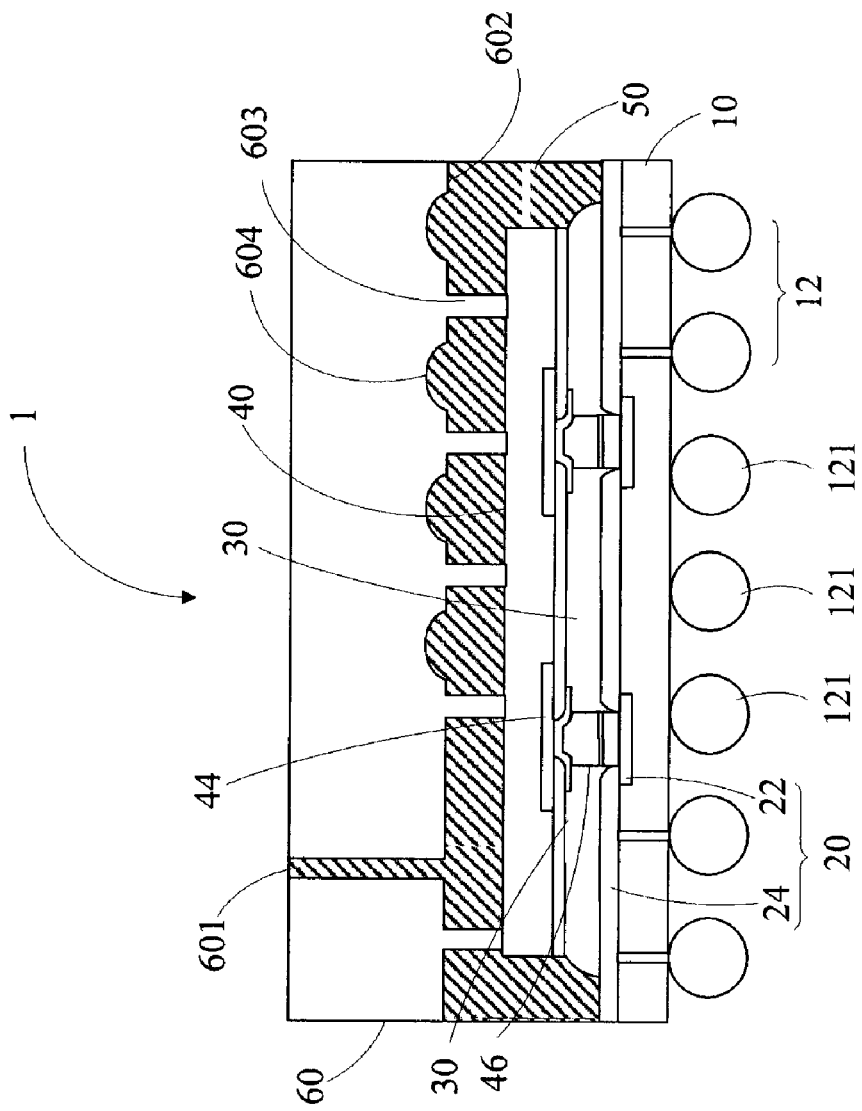
Figure 2E:
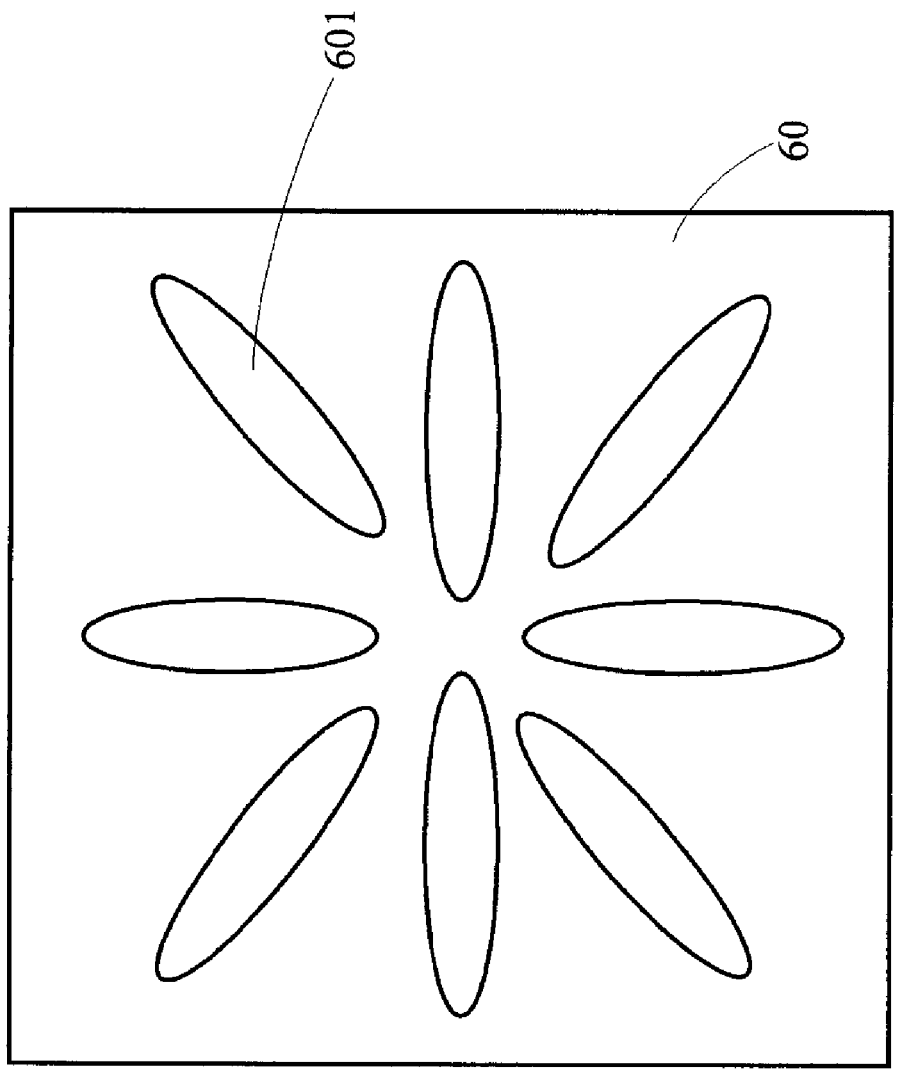

Referring next to FIG. 2D, a metal layer 60 is provided. The metal layer 60 is coated in advance with an encapsulant 50, which is a composite resin layer. Afterwards, a pre-heating device (not shown) is used to heat the metal layer 60 and the encapsulant 50 coated thereon so as to soften the composite resin layer thereon, and then the chip 40 on the substrate 10 is covered by the encapsulant 50 so that the chip 40 is buried in the composite resin layer. Preferably, the heating is carried out at a temperature of 100° C. to 250° C. and a pressure is applied for about several minutes to several hours to solidify the encapsulant 50. Finally, steps of implanting solder balls 12 and slicing the substrate 10 are performed to form a plurality of integrated circuits (ICs). It shall be noted that, the metal layer 60 may be further formed with openings patterned on a surface thereof. The patterned openings may be openings in a mesh pattern that are equally spaced on the surface of the metal layer 60; alternatively, the patterned openings may also be arranged in other forms, e.g., in form of a plurality of annular openings or other irregular forms. As shown in FIG. 2E, if the metal layer 60 has radial openings 601 patterned thereon, then when the encapsulant 50 is pre-heated, the encapsulant 50 is converted into a softened state but is not softened to an extent that causes it to flow out of the openings. Moreover, through arrangement of the bonding surface 602, the bonding between the encapsulant 50 and the metal layer 60 is enhanced. However, to effectively ensure that undue overflow of the encapsulant will not occur, a film (not shown) may be disposed at a side opposite to the metal layer 60 to block overflow of the encapsulant out of the openings. Subsequently, after the encapsulant 50 is bonded with the chip 40, the film on the metal layer may be selectively retained or removed.

In summary, the method for manufacturing a semiconductor structure disclosed in the present invention replaces the conventional bumps, which use gold as a primary material, with the composite bumps, so the cost of semiconductor packaging is lowered; furthermore, the method for manufacturing a semiconductor structure of the present invention retains the metal layer, which is originally used as a support layer of the encapsulant, in the semiconductor structure to assist in conducting heat generated in the semiconductor structure in further operations, so the heat conduction efficiency and thus the operational stability of the semiconductor structure can be improved remarkably.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a semiconductor structure, the method comprising the following steps of:
   (a) forming a substrate having a package array, wherein the package array has a plurality of contact pads and a protection layer, and the plurality of the contact pads are exposed to the outer side of the protection layer;
   (b) forming a thermosetting non-conductive layer covering the substrate;
   (c) partially solidifying the thermosetting non-conductive layer to form a semi-solid non-conductive layer;
   (d) connecting chips to the package array on the substrate, wherein each of the chips has an active surface, a plurality of chip pads and a plurality of composite bumps, the chip pads are formed on the active surface, and the composite bumps are formed on the chip pads so that the composite bumps electrically connect to each of the contact pads;
   (e) pressing and heating the chips and the substrate so that the semi-solid non-conductive layer adheres with the chips and the substrate;
   (f) pre-heating an encapsulant preformed on a metal layer;
   (g) after step (f), covering the chips on the substrate with the encapsulant; and
   (h) solidifying the encapsulant to completely cover the chips on the substrate.

2. The method as claimed in claim 1, wherein the step of partially solidifying the thermosetting non-conductive layer in the step (c) is to lighten with ultraviolet light or to heat by curing.

3. The method as claimed in claim 1, wherein the step (e) is to solidify the semi-solid non-conductive layer further.

4. The method as claimed in claim 1, wherein the step of solidifying the encapsulant in the step (h) is to heat the encapsulant.

5. The method as claimed in claim 1, wherein the step (h) is to solidify the encapsulant and the semi-solid non-conductive layer simultaneously.

6. The method as claimed in claim 1, wherein the step of forming each of the composite bumps further comprises the steps of:
   forming an under bump metallization (UBM) layer on each of the chip pads;
   forming a first conductive layer on each of the UBM layers; and
   forming a second conductive layer on each of the first conductive layers.

7. The method as claimed in claim 6, further comprising the following step after forming the second conductive layer:
   forming a covering conductive layer to cover the second conductive layer, the first conductive layer and the UBM layer.

8. The method as claimed in claim 7, wherein the step of forming the covering conductive layer is to form the covering conductive layer with gold.

9. The method as claimed in claim 7, further comprising the following step after forming the first conductive layer:
   forming a barrier layer between the first conductive layer and the second conductive layer.

10. The method as claimed in claim 9, wherein the step of forming the barrier layer is to form the barrier layer with nickel.

11. The method as claimed in claim 6, wherein the step of forming the second conductive layer is to form the second conductive layer with a material selected from a group consisting of gold, copper, silver, tin, zinc, indium, and combinations thereof.

12. The method as claimed in claim 6, wherein the step of forming the first conductive layer is to form the first conductive layer with a material selected from a group consisting of copper, nickel, aluminum, zinc, and combinations thereof.

* * * * *